United States Patent
Ito et al.

(10) Patent No.: US 10,338,467 B2
(45) Date of Patent: Jul. 2, 2019

(54) METHOD OF PRODUCING FILM

(71) Applicant: CANON KABUSHIKI KAISHA, Tokyo (JP)

(72) Inventors: Toshiki Ito, Kawasaki (JP); Takeshi Honma, Tokyo (JP); Shiori Yonezawa, Tokyo (JP); Youji Kawasaki, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 288 days.

(21) Appl. No.: 14/909,857

(22) PCT Filed: Sep. 5, 2014

(86) PCT No.: PCT/JP2014/074152
§ 371 (c)(1),
(2) Date: Feb. 3, 2016

(87) PCT Pub. No.: WO2015/041154
PCT Pub. Date: Mar. 26, 2015

(65) Prior Publication Data
US 2016/0187774 A1    Jun. 30, 2016

(30) Foreign Application Priority Data

Sep. 18, 2013 (JP) ................ 2013-192965
Feb. 26, 2014 (JP) ................ 2014-035124

(51) Int. Cl.
*G03F 7/031* (2006.01)
*H05K 3/00* (2006.01)
(Continued)

(52) U.S. Cl.
CPC ........ *G03F 7/031* (2013.01); *C08F 222/1006* (2013.01); *G03F 7/0002* (2013.01);
(Continued)

(58) Field of Classification Search
CPC ........ G03F 7/0002; G03F 7/027; G03F 7/029; G03F 7/031; C08F 222/1006;
(Continued)

(56) References Cited

U.S. PATENT DOCUMENTS 3,840,390 A * 10/1974 Kozu ............... G03F 7/027
427/514
4,144,156 A * 3/1979 Kuesters ............ G03F 7/031
428/413

(Continued)

FOREIGN PATENT DOCUMENTS

EP      1 731 963 A2   12/2006
JP      2008-19292 A    1/2008
(Continued)

OTHER PUBLICATIONS

Decision of Refusal in Japanese Application No. 2014-151404 (dated Jan. 24, 2017).

(Continued)

Primary Examiner — A. Dexter Tugbang
(74) Attorney, Agent, or Firm — Venable LLP (57) ABSTRACT

A method of producing a film includes: a disposing step of disposing a photocurable composition on a substrate; a mold contact step of bringing the photocurable composition and a mold into contact with each other; a photoirradiation step of irradiating the photocurable composition with light to form a cured product; and a mold release step of releasing the cured product and the mold from each other, in which the method further includes an alignment step of aligning the mold and the substrate with each other before the photoirradiation step, in which the photocurable composition contains at least a polymerizable compound serving as a component (A) and a photopolymerization initiator serving as a component (B), and in which the polymerizable compound has a polymerization conversion ratio of 50% or more when (Continued)

exposed to light under conditions of an illuminance of 0.12 mW/cm² and an exposure time of 11.0 seconds.

17 Claims, 3 Drawing Sheets

(51) Int. Cl.
  *G03F 7/00* (2006.01)
  *H05K 3/10* (2006.01)
  *G03F 7/027* (2006.01)
  *G03F 7/029* (2006.01)
  *C08F 222/10* (2006.01)

(52) U.S. Cl.
  CPC .............. *G03F 7/027* (2013.01); *G03F 7/029* (2013.01); *H05K 3/0005* (2013.01); *H05K 3/0044* (2013.01); *H05K 3/101* (2013.01); *C08F 2222/1013* (2013.01); *Y10T 29/49158* (2015.01)

(58) Field of Classification Search
  CPC ....... C08F 222/1013; C08F 2222/1013; H05K 3/0005; H05K 3/0044; H05K 3/101; Y10T 29/49158
  See application file for complete search history.

(56) References Cited

U.S. PATENT DOCUMENTS

| | | | |
|---|---|---|---|
| 4,917,977 A * | 4/1990 | Smothers | G03F 7/031 430/1 |
| 4,957,946 A * | 9/1990 | Meier | G03F 7/029 430/280.1 |
| 6,020,093 A * | 2/2000 | Shibuya | G03F 7/012 430/167 |
| 7,794,222 B2 | 9/2010 | Suehira et al. | |
| 7,854,604 B2 | 12/2010 | Yoneda et al. | |
| 8,282,868 B2 | 10/2012 | Yoneda et al. | |
| 8,672,661 B2 | 3/2014 | Minoda | |
| 8,770,958 B2 | 7/2014 | Suehira et al. | |
| 8,770,964 B2 | 7/2014 | Kawakami | |
| 9,046,793 B2 | 6/2015 | Suehira et al. | |
| 9,376,581 B2 | 6/2016 | Kitagawa et al. | |
| 9,623,439 B2 | 4/2017 | Ito et al. | |
| 2004/0040008 A1* | 2/2004 | Ahrikencheikh | H05K 3/0005 716/122 |
| 2006/0081557 A1* | 4/2006 | Xu | G03F 7/0002 216/48 |
| 2009/0286020 A1* | 11/2009 | Asai | G03F 7/0007 428/29 |
| 2012/0029110 A1 | 2/2012 | Washiya et al. | |
| 2012/0164346 A1* | 6/2012 | Yoneda | G03F 7/0002 427/553 |
| 2013/0052431 A1 | 2/2013 | Enomoto et al. | |
| 2013/0221556 A1 | 8/2013 | Miyaharu et al. | |
| 2014/0037900 A1 | 2/2014 | Takihara et al. | |
| 2014/0327183 A1 | 11/2014 | Mori et al. | |
| 2014/0329057 A1 | 11/2014 | Matsufuji et al. | |
| 2014/0349086 A1 | 11/2014 | Ito et al. | |
| 2014/0374884 A1 | 12/2014 | Kitagawa et al. | |
| 2015/0004790 A1 | 1/2015 | Murayama et al. | |
| 2015/0050426 A1 | 2/2015 | Ito et al. | |
| 2015/0075855 A1 | 3/2015 | Ito et al. | |
| 2015/0140227 A1 | 5/2015 | Iida et al. | |
| 2015/0183942 A1 | 7/2015 | Ito et al. | |
| 2015/0210790 A1 | 7/2015 | Ito et al. | |
| 2015/0368433 A1 | 12/2015 | Kitagawa et al. | |
| 2016/0160003 A1 | 6/2016 | Kitagawa et al. | |
| 2016/0215074 A1 | 7/2016 | Honma et al. | |

FOREIGN PATENT DOCUMENTS

| | | | |
|---|---|---|---|
| JP | 2008-105414 A | | 5/2008 |
| JP | 2008-155344 A | | 7/2008 |
| JP | 2008-183732 A | | 8/2008 |
| JP | 2009-209337 A | | 9/2009 |
| JP | 2009208409 A | * | 9/2009 |
| JP | 2010-073811 A | | 4/2010 |
| JP | 2010-100785 A | | 5/2010 |
| JP | 2010-114209 A | | 5/2010 |
| JP | 2010-245130 A | | 10/2010 |
| JP | 2011-111553 A | | 6/2011 |
| JP | 2011-146447 A | | 7/2011 |
| JP | 2011-157482 A | | 8/2011 |
| JP | 2011-235571 A | | 11/2011 |
| JP | 2012-31240 A | | 2/2012 |
| JP | 2012-134116 A | | 7/2012 |
| JP | 2012-156357 A | | 8/2012 |
| JP | 2012-164809 A | | 8/2012 |
| JP | 2013-062489 A | | 4/2013 |
| JP | 2013-089939 A | | 5/2013 |
| JP | 2013-110196 A | | 6/2013 |
| JP | 2013-110383 A | | 6/2013 |
| JP | 2013-122044 A | | 6/2013 |
| JP | 2013-165103 A | | 8/2013 |
| JP | 2013-168645 A | | 8/2013 |
| JP | 2013-175684 A | | 9/2013 |
| JP | 2014-151404 A | | 8/2014 |
| KR | 10-2013-0023092 A | | 3/2013 |
| TW | 2013-19738 A1 | | 5/2013 |
| TW | 2013-34031 A1 | | 8/2013 |
| TW | 2013-36874 A | | 9/2013 |
| WO | 2012/141238 A1 | | 10/2012 |
| WO | 2013/062068 A1 | | 5/2013 |
| WO | 2013/094390 A1 | | 6/2013 |
| WO | 2013/118791 A1 | | 8/2013 |
| WO | 2015/030151 A1 | | 3/2015 |
| WO | 2015/030258 A1 | | 3/2015 |

OTHER PUBLICATIONS

Communication Pursuant to Article 94(3) EPC in European Application No. 14846207.0 (Oct. 20, 2017).
First Office Action in Chinese Application No. 201480051516.7 (dated Nov. 6, 2017).
Office Action in Taiwanese Application No. 103131359 (dated Apr. 2015).
Extended European Search Report in European Application No. 14846207.0 (dated Feb. 15, 2017).
Notice of Preliminary Rejection in Korean Application No. 10-2016-7009240 (dated Jan. 13, 2017).
Notice of Preliminary Rejection in Korean Application No. 10-2016-7009240 (dated Sep. 6, 2017).
Notification of Reason for Refusal in Korean Application No. 10-2017-7022179 (dated Sep. 11, 2017).
Notification of Reasons for Refusal in Japanese Application No. 2014-151404 (dated Oct. 11, 2016).
Notification of Reasons for Refusal in Japanese Application No. 2017-085544 (dated Jun. 19, 2018 ).

* cited by examiner

FIG. 1

FIG. 2A
STEP [1]

FIG. 2B
STEP [2]

FIG. 2C
STEP [3]

FIG. 2D
STEP [4]

FIG. 2E
STEP [5]

FIG. 2F
STEP [6]

FIG. 2G
STEP [7]

FIG. 3

METHOD OF PRODUCING FILM

TECHNICAL FIELD

The present invention relates to a method of producing a film involving using a photocurable composition, a method of producing an optical component, a method of producing a circuit board, and a method of producing an electronic component each involving using the method of producing a film, and a photocurable composition.

BACKGROUND ART

In semiconductor devices, MEMS, and the like, there is an increasing demand for miniaturization. Therefore, in recent years, besides the related-art photolithography technology, a micro processing technology involving using a pattern of a resist (photocurable composition) having a predetermined shape formed on a substrate (wafer) as a mold has been attracting attention. The micro processing technology is also called a photonanoimprint technology and is capable of forming a fine structure of the order of several nanometers on a substrate (see, for example, PTL 1). In the photonanoimprint technology, first, a resist is applied onto a pattern forming region on a substrate (disposing step). Next, the resist is molded through use of a mold having formed thereon a pattern (mold contact step). Then, the resist is irradiated with light to be cured (photoirradiation step) and released (mold release step). A resin pattern (photo-cured product) having a predetermined shape is formed on the substrate by performing the above-mentioned steps. Further, fine structures can be formed on the entire substrate by repeating all the steps at other positions on the substrate.

In particular, in production of semiconductor devices, MEMS, and the like, micro processing is further performed in some cases through use of the photonanoimprint technology with respect to the substrate which has already been processed. In this case, it is necessary that the position of the mold be accurately aligned with the pattern which has already been formed on the substrate. The step to be performed in this case is called an alignment step and is performed between the mold contact step and the photoirradiation step. Further, in the photonanoimprint technology, a series of steps (shot) from the disposing step to the mold release step is performed a plurality of times on the same substrate in most cases.

CITATION LIST

Patent Literature

PTL 1: Japanese Patent Application Laid-Open No. 2010-073811

SUMMARY OF INVENTION

Technical Problem

In the meantime, in the photoirradiation step, part of irradiation light is absorbed by the substrate, and hence heat (exposure heat) is generated in the substrate. In a region in which the exposure heat is generated, thermal strain of the substrate caused by the exposure heat occurs locally. Further, the thermal strain of the substrate caused by the exposure heat extends to a portion adjacent to the exposed region as well as the exposed region. Therefore, the following problem has been revealed: the alignment accuracy is low in the shot of an adjacent region.

As a method of enhancing the alignment accuracy while reducing exposure heat, a method involving reducing an exposure dose for irradiation is considered. However, another problem has been also revealed simultaneously: when the method involving reducing an exposure dose is used, a photocurable composition is not cured sufficiently (curing defect), with the result that a pattern collapses in the mold release step.

The present invention has been accomplished to solve the above-mentioned problems, and an object of the present invention is to provide a method of producing a film having high alignment accuracy and having less pattern collapse defects in a photonanoimprint method.

Solution to Problem

A method of producing a film according to one aspect of the present invention includes:

a disposing step of disposing a photocurable composition on a substrate;

a mold contact step of bringing the photocurable composition and a mold into contact with each other;

a photoirradiation step of irradiating the photocurable composition with light to form a cured product; and a mold release step of releasing the cured product and the mold from each other, in which the method further includes an alignment step of aligning the mold and the substrate with each other before the photoirradiation step, in which the photocurable composition contains at least a polymerizable compound serving as a component (A) and a photopolymerization initiator serving as a component (B), and in which the polymerizable compound has a polymerization conversion ratio of 50% or more when exposed to light under conditions of an illuminance of 0.12 mW/cm² and an exposure time of 11.0 seconds.

According to another aspect of the present invention, it is possible to provide the method of producing a film having high alignment accuracy and having less pattern collapse defects in a photonanoimprint method.

Further features of the present invention will become apparent from the following description of exemplary embodiments with reference to the attached drawings.

DESCRIPTION OF EMBODIMENTS

An embodiment of the present invention is described in detail below with reference to the drawings. However, the present invention is not limited to the embodiment to be described below. In other words, the present invention comprehends embodiments obtained by, for example, appropriately changing or modifying the embodiment to be described below based on the ordinary knowledge of a person skilled in the art to the extent that such change or modification does not deviate from the gist of the present invention. A method of producing a film of the present invention includes the following steps [1] to [5]:

[1] a step of disposing a photocurable composition on a substrate (substrate to be processed) (disposing step);
[2] a step of bringing the photocurable composition and a mold into contact with each other (mold contact step);
[3] a step of aligning the mold and the substrate with each other (alignment step);
[4] a step of irradiating the photocurable composition with light to form a cured product (photoirradiation step); and
[5] a step of releasing the cured product and the mold from each other after the photoirradiation step (mold release step).

In the present invention, the photocurable composition contains at least a polymerizable compound serving as a component (A) and a photopolymerization initiator serving as a component (B). Further, in the present invention, the polymerizable compound has a polymerization conversion ratio of 50% or more when exposed to light under the conditions of an illuminance of 0.12 mW/cm$^2$ and an exposure time of 11.0 seconds.

[Photocurable Composition]

First, the photocurable composition is described. The photocurable composition to be used in the present invention is a photocurable composition containing the following component (A) and component (B).

(A) Polymerizable Compound
(B) Photopolymerization Initiator

Each component is hereinafter described in detail.

<Component (A): Polymerizable Compound>

The component (A) is a polymerizable compound. The polymerizable compound as used in this embodiment and the present invention is a compound which reacts with a polymerization factor (radical, etc.) generated from the photopolymerization initiator (component (B)) to form a film made of a polymer compound by a chain reaction (polymerization reaction).

As the above-mentioned polymerizable compound, for example, there is given a radical polymerizable compound. The polymerizable compound serving as the component (A) may be formed of one kind of polymerizable compound or a plurality of kinds of polymerizable compounds. Here, it is preferred that the radical polymerizable compound be a compound having one or more acryloyl group or methacryloyl groups.

That is, in the present invention, the component (A) (polymerizable compound) of the photocurable composition preferably includes a (meth)acrylic compound. In the present invention, more preferably, 90 wt % or more of the component (A) is a (meth)acrylic compound.

Examples of monofunctional (meth)acrylic compounds having one acryloyl group or methacryloyl group include, but not limited to, phenoxyethyl (meth)acrylate, phenoxy-2-methylethyl (meth) acrylate, phenoxyethoxyethyl (meth) acrylate, 3-phenoxy-2-hydroxypropyl (meth) acrylate, 2-phenylphenoxyethyl (meth)acrylate, 4-phenylphenoxyethyl (meth)acrylate, 3-(2-biphenyl)-2-hydroxypropyl (meth)acrylate, EO-modified p-cumylphenyl (meth)acrylate, 2-bromophenoxyethyl (meth) acrylate, 2,4-dibromophenoxyethyl (meth) acrylate, 2,4,6-tribromophenoxyethyl (meth) acrylate, EO-modified phenoxy (meth)acrylate, PO-modified phenoxy (meth)acrylate, polyoxyethylene nonylphenyl ether (meth) acrylate, isobornyl (meth) acrylate, 1-adamantyl (meth)acrylate, 2-methyl-2-adamantyl (meth) acrylate, 2-ethyl-2-adamantyl (meth) acrylate, bornyl (meth) acrylate, tricyclodecanyl (meth) acrylate, dicyclopentanyl (meth) acrylate, dicyclopentenyl (meth) acrylate, cyclohexyl (meth) acrylate, 4-butylcyclohexyl (meth) acrylate, acryloyl morpholine, 2-hydroxyethyl (meth)acrylate, 2-hydroxypropyl (meth)acrylate, 2-hydroxybutyl (meth) acrylate, methyl (meth) acrylate, ethyl (meth)acrylate, propyl (meth)acrylate, isopropyl (meth) acrylate, butyl (meth)acrylate, amyl (meth) acrylate, isobutyl (meth)acrylate, t-butyl (meth)acrylate, pentyl (meth)acrylate, isoamyl (meth)acrylate, hexyl (meth) acrylate, heptyl (meth)acrylate, octyl (meth)acrylate, isooctyl (meth)acrylate, 2-ethylhexyl (meth)acrylate, nonyl (meth)acrylate, decyl (meth)acrylate, isodecyl (meth)acrylate, undecyl (meth)acrylate, dodecyl (meth)acrylate, lauryl (meth)acrylate, stearyl (meth)acrylate, isostearyl (meth) acrylate, benzyl (meth) acrylate, tetrahydrofurfuryl (meth) acrylate, butoxyethyl (meth)acrylate, ethoxy diethylene glycol (meth) acrylate, polyethylene glycol mono(meth)acrylate, polypropylene glycol mono(meth)acrylate, methoxy ethylene glycol (meth)acrylate, ethoxyethyl (meth)acrylate, methoxy polyethylene glycol (meth)acrylate, methoxy polypropylene glycol (meth)acrylate, 1-naphthylmethyl (meth) acrylate, 2-naphthylmethyl (meth) acrylate, diacetone (meth) acrylamide, isobutoxymethyl (meth) acrylamide, N,N-dimethyl (meth) acrylamide, t-octyl (meth) acrylamide, dimethylaminoethyl (meth) acrylate, diethylaminoethyl (meth) acrylate, 7-amino-3,7-dimethyloctyl (meth)acrylate, N,N-diethyl (meth)acrylamide, and N,N-dimethylaminopropyl (meth) acrylamide.

Examples of commercially available products corresponding to the monofunctional (meth)acrylic compounds include, but not limited to: Aronix M101, M102, M110, M111, M113, M117, M5700, 10-1317, M120, M150, and M156 (all of the above are manufactured by TOAGOSEI CO., LTD); MEDOL10, MIBDOL10, CHDOL10, MMDOL30, MEDOL30, MIBDOL30, CHDOL30, LA, IBXA, 2-MTA, HPA, and Viscoat #150, #155, #158, #190, #192, #193, #220, #2000, #2100, and #2150 (all of the above are manufactured by OSAKA ORGANIC CHEMICAL INDUSTRY LTD.); Light Acrylate BO-A, EC-A, DMP-A, THF-A, HOP-A, HOA-MPE, HOA-MPL, PO-A, P-200A, NP-4EA, and NP-8EA, and Epoxy Ester M-600A (all of the above are manufactured by KYOEISHA CHEMICAL CO., LTD.); KAYARAD TC110S, R-564, and R-128H (all of the above are manufactured by NIPPON KAYAKU Co., Ltd.); NK Ester AMP-10G and AMP-20G (both of the above are manufactured by Shin-Nakamura Chemical Co., Ltd.); FA-511A, 512A, and 513A (all of the above are manufactured by Hitachi Chemical Co., Ltd.); PHE, CEA, PHE-2, PHE-4, BR-31, BR-31M, and BR-32 (all of the above are manufactured by Dai-ichi Kogyo Seiyaku Co., Ltd.); VP (manufactured by BASF); and ACMO, DMAA, and DMA-PAA (all of the above are manufactured by KOHJIN Co., Ltd.). Examples of polyfunctional (meth)acrylic compounds having two or more acryloyl groups or methacryloyl groups include, but not limited to, trimethylolpropane di(meth)acrylate, trimethylolpropane tri(meth)acrylate, EO-modified trimethylolpropane tri(meth)acrylate, PO-modified trimethylolpropane tri(meth)acrylate, EO,PO-modified trimethylolpropane tri(meth)acrylate, pentaerythritol tri(meth)acrylate, pentaerythritol tetra(meth)acrylate, ethylene glycol di(meth)acrylate, tetraethylene glycol di(meth)acrylate, polyethylene glycol di(meth)acrylate, polypropylene glycol di(meth)acrylate, 1,4-butanediol di(meth)acrylate, 1,6-hexanediol di(meth)acrylate, neopentyl glycol di(meth)acrylate, tris(2-hydroxyethyl)isocyanurate tri(meth)acrylate, tris(acryloyloxy) isocyanurate, bis(hydroxymethyl)tricyclodecane di(meth)

acrylate, dipentaerythritol penta(meth)acrylate, dipentaerythritol hexa(meth)acrylate, EO-modified 2,2-bis(4-((meth)acryloxy)phenyl)propane, PO-modified 2,2-bis(4-((meth)acryloxy)phenyl)propane, EO,PO-modified 2,2-bis(4-((meth)acryloxy)phenyl)propane phenylethylene glycol di(meth)acrylate, o-xylyene di(meth)acrylate, m-xylyene di(meth)acrylate, and p-xylyene di(meth)acrylate.

Examples of commercially available products corresponding to the polyfunctional (meth)acrylic compounds include, but not limited to: Upimer UV SA1002 and SA2007 (both of the above are manufactured by Mitsubishi Chemical Corporation); Viscoat #195, #230, #215, #260, #335HP, #295, #300, #360, #700, GPT, and 3PA (all of the above are manufactured by OSAKA ORGANIC CHEMICAL INDUSTRY LTD.); Light Acrylate 4EG-A, 9EG-A, NP-A, DCP-A, BP-4EA, BP-4PA, TMP-A, PE-3A, PE-4A, and DPE-6A (all of the above are manufactured by KYOEISHA CHEMICAL CO., LTD.); KAYARAD PET-30, TMPTA, R-604, DPHA, DPCA-20, -30, -60, and -120, and HX-620, D-310, and D-330 (all of the above are manufactured by NIPPON KAYAKU Co., Ltd.); Aronix M208, M210, M215, M220, M240, M305, M309, M310, M315, M325, and M400 (all of the above are manufactured by TOAGOSEI CO., LTD); and Lipoxy VR-77, VR-60, and VR-90 (all of the above are manufactured by SHOWA DENKO K.K.).

It is to be noted that, in the above-mentioned compound group, the term "(meth)acrylate" means acrylate and methacrylate having an alcohol residue equal to the acrylate. The term "(meth)acryloyl group" means an acryloyl group and a methacryloyl group having an alcohol residue equal to the acryloyl group. The abbreviation "EO" refers to ethylene oxide, and the term "EO-modified compound A" means a compound in which a (meth)acrylic acid residue and an alcohol residue of the compound (A) are bonded to each other through a block structure of an ethylene oxide group. Further, the abbreviation "PO" refers to propylene oxide, and the term "PO-modified compound B" means a compound in which a (meth)acrylic acid residue and an alcohol residue of the compound (B) are bonded to each other through a block structure of a propylene oxide group. Of those, it is preferred that the component (A) include at least one or more of isobornyl acrylate, benzyl acrylate, 2-naphthylmethyl acrylate, m-xylylene diacrylate, dimethyloltricyclodecane diacrylate, phenylethylene glycol diacrylate, and neopentyl glycol diacrylate, and it is more preferred that the component (A) include at least two or more thereof. It is still more preferred that the component (A) consist of: isobornyl acrylate, benzyl acrylate, and neopentyl glycol diacrylate; benzyl acrylate and m-xylylene diacrylate; benzyl acrylate, 2-naphthylmethyl acrylate, and m-xylylene diacrylate; benzyl acrylate and dimethyloltricyclodecane diacrylate; or benzyl acrylate and phenylethylene glycol diacrylate.

<Component (B): Photopolymerization Initiator>

The component (B) is a photopolymerization initiator. The photopolymerization initiator as used in this embodiment and the present invention is a compound which detects light having a predetermined wavelength to generate the above-mentioned polymerization factor (radical). Specifically, the photopolymerization initiator is a polymerization initiator (radical generator) which generates a radical with light (an infrared ray, a visible ray, an ultraviolet ray, a far ultraviolet ray, and a radiation, for example, an X-ray and a charged particle ray such as an electron beam). From the viewpoint of light with which the photocurable composition is irradiated, specifically, the photopolymerization initiator is a polymerization initiator which generates a radical with light having a wavelength of from 200 nm to 500 nm, typically from 300 nm to 450 nm.

The photopolymerization initiator serving as the component (B) may be formed of one kind of photopolymerization initiator or a plurality of kinds of photopolymerization initiators.

Examples of the radical generator include, but not limited to: 2,4,5-triarylimidazole dimers that may have a substituent such as a 2-(o-chlorophenyl)-4,5-diphenylimidazole dimer, a 2-(o-chlorophenyl)-4,5-di(methoxyphenyl)imidazole dimer, a 2-(o-fluorophenyl)-4,5-diphenylimidazole dimer, and a 2-(o- or p-methoxyphenyl)-4,5-diphenylimidazole dimer; benzophenone derivatives such as benzophenone, N,N,N',N'-tetramethyl-4,4'-diaminobenzophenone (Michler's ketone), N,N,N',N'-tetraethyl-4,4'-diaminobenzophenone, 4-methoxy-4'-dimethylaminobenzophenone, 4-chlorobenzophenone, 4,4'-dimethoxybenzophenone, and 4,4'-diaminobenzophenone; aromatic ketone derivatives such as 2-benzyl-2-dimethylamino-1-(4-morpholinophenyl)-1-butanone, 1,2-methyl-1-[4-(methylthio)phenyl]-2-morpholino-propanon-1-one; quinones such as 2-ethylanthraquinone, phenanthrenequinone, 2-t-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone, and 2,3-dimethylanthraquinone; benzoin ether derivatives such as benzoin methyl ether, benzoin ethyl ether, and benzoin phenyl ether; benzoin derivatives such as benzoin, methylbenzoin, ethylbenzoin, and propylbenzoin; benzyl derivatives such as benzyl dimethyl ketal; acridine derivatives such as 9-phenylacridine and 1,7-bis(9,9'-acridinyl)heptane; N-phenylglycine derivatives such as N-phenylglycine; acetophenone derivatives such as acetophenone, 3-methylacetophenone, acetophenone benzyl ketal, 1-hydroxycyclohexyl phenyl ketone, and 2,2-dimethoxy-2-phenylacetophenone; thioxanthone derivatives such as thioxanthone, diethylthioxanthone, 2-isopropylthioxanthone, and 2-chlorothioxanthone; xanthone, fluorenone, benzaldehyde, fluorene, anthraquinone, triphenylamine, carbazole, 1-(4-isopropylphenyl)-2-hydroxy-2-methylpropan-1-one, 2-hydroxy-2-methyl-1-phenylpropan-1-one; and phosphine oxide derivatives such as 2,4,6-trimethylbenzoyldiphenylphosphine oxide, and bis(2,6-dimethoxybenzoyl)-2,4,4-trimethylpentylphosphine oxide. The component (B) of the photocurable composition is preferably an aromatic ketone derivative or a phosphine oxide derivative. In the case where the aromatic ketone derivative is used as the component (B) of the photocurable composition, 2-benzyl-2-dimethylamino-1-(4-morpholinophenyl)-1-butanone is particularly preferred. In the case where the phosphine oxide derivative is used as the component (B) of the photocurable composition, 2,4,6-trimethylbenzoyldiphenylphosphine oxide is particularly preferred. The reason that these derivatives are preferred is that, in particular, they have high photopolymerization initiating capability. It is to be noted that the term "derivative" as described here refers to a compound having a common skeleton. Specifically, the aromatic ketone derivative refers to a compound having a carbonyl group (>C=O) and two kinds of substituents (provided that any one of the two kinds of substituents is an aromatic group) which are bonded to the carbon atom contained in the carbonyl group. Further, the phosphine oxide derivative refers to a compound including a partial structure P=O.

Examples of commercially available products corresponding to the photoradical generator include, but not limited to, Irgacure 184, 369, 651, 500, 819, 907, 784, and 2959, CGI-1700, -1750, and -1850, CG24-61, Darocur 1116 and 1173 Lucirin TPO, LR8893, and LR8970 (all of the above are manufactured by BASF), and Ubecryl P36 (manufactured by UCB).

The blending ratio of the polymerization initiator serving as the component (B) in the photocurable composition is 0.01 wt % or more and 10 wt % or less, preferably 0.1 wt % or more and 7 wt % or less with respect to the total amount of the polymerizable compound serving as the component (A) for the following reasons. When the blending ratio of the polymerization initiator is 0.01 wt % or more with respect to the total amount of the component (A), a decrease in reaction efficiency caused by a decrease in curing speed can be prevented more easily. When the blending ratio of the polymerization initiator is 10.0 wt % or less with respect to the total amount of the component (A), the degradation of mechanical characteristics of a cured product of the photocurable composition can be prevented in most cases.

<Other Additive Components>

The photocurable composition of this embodiment may contain further additive components in a range not impairing the effects of the present invention according to various purposes, in addition to the above-mentioned components (A) and (B). Examples of the additive components include a surfactant, a sensitizer, a hydrogen donor, an antioxidant, a solvent, and a polymer component. In the present invention, it is preferred that the photocurable composition contain a sensitizer.

The sensitizer is a compound to be added appropriately for the purpose of accelerating a polymerization reaction or enhancing a reaction conversion ratio. As the sensitizer, for example, there is given a sensitizing dye.

The sensitizing dye is a compound that is excited by absorbing light having a specific wavelength to interact with the polymerization initiator serving as the component (B). It is to be noted that the term "interaction" as used herein refers to, for example, the transfer of energy or an electron from the sensitizing dye in an excited state to the polymerization initiator serving as the component (B).

Specific examples of the sensitizing dye include, but not limited to, an anthracene derivative, an anthraquinone derivative, a pyrene derivative, a perylene derivative, a carbazole derivative, a benzophenone derivative, a thioxanthone derivative, a xanthone derivative, a coumarin derivative, a phenothiazine derivative, a camphorquinone derivative, an acridine-based dye, a thiopyrylium salt-based dye, a merocyanine-based dye, a quinoline-based dye, a styrylquinoline-based dye, a ketocoumarin-based dye, a thioxanthene-based dye, a xanthene-based dye, an oxonol-based dye, a cyanine-based dye, a rhodamine-based dye, and a pyrylium salt-based dye.

One kind of the sensitizers may be used alone, or two or more kinds thereof may be used as a mixture.

The hydrogen donor is a compound capable of reacting with an initiation radical generated from the polymerization initiator serving as the component (B) or the radical of a polymerization growth terminal to generate a more reactive radical. The hydrogen donor is preferably added when the polymerization initiator serving as the component (B) is a photoradical generator.

Specific examples of the hydrogen donor include, but not limited to, n-butylamine, di-n-butylamine, tri-n-butylphosphine, allylthiourea, S-benzylisothiuronium-p-toluenesulfinate, triethylamine, diethylaminoethyl methacrylate, triethylenetetramine, 4,4'-bis(dialkylamino)benzophenone, N,N-dimethylaminobenzoic acid ethyl ester, N,N-dimethylaminobenzoic acid isoamyl ester, pentyl-4-dimethylaminobenzoate, triethanolamine, N-phenylglycine, and other amine compounds, 2-mercapto-N-phenylbenzimidazole, mercaptopropionic acid ester, and other mercapto compounds.

One kind of the hydrogen donors may be used alone, or two or more kinds thereof may be used as a mixture. In the case where the photocurable composition of this embodiment contains the sensitizer and the hydrogen donor as the additive components, the added amount of the additive components is preferably 0 wt % or more and 20 wt % or less, more preferably 0.1 wt % or more and 5.0 wt % or less, still more preferably 0.2 wt % or more and 2.0 wt % or less with respect to the total amount of the polymerizable compound serving as the component (A). When the content of the sensitizer is 0.1 wt % or more, the effect of accelerating polymerization can be expressed more effectively. Further, when the content is set to 5.0 wt % or less, the molecular weight of a polymer compound forming a photo-cured product to be produced becomes sufficiently high, and a solution defect and the degradation of storage stability can be suppressed more easily.

Further, the ratio between the component (A) and the component (B) can be determined by analyzing a photo-cured product obtained by curing the photocurable composition of this embodiment by infrared spectroscopy, ultraviolet-visible spectroscopy, pyrolysis gas chromatography-mass spectrometry, or the like. Further, it is considered that the ratio between the component (A) and the component (B) contained in the photocurable composition is almost the same as that in the photo-cured product. Therefore, if the ratio between the component (A) and the component (B) contained in the photo-cured product is determined, the ratio between the component (A) and the component (B) contained in the photocurable composition can be determined consequently.

<Temperature at Time of Blending of Photocurable Composition>

When the photocurable composition of this embodiment is prepared, at least the component (A) and the component (B) are mixed and dissolved under a predetermined temperature condition. Specifically, the preparation is performed in a range of from 0° C. or more to 100° C. or less.

<Viscosity of Photocurable Composition>

As the viscosity of the photocurable composition of this embodiment, the viscosity of a mixture of components excluding a solvent at 23° C. is preferably 1 cP or more and 100 cP or less, more preferably 5 cP or more and 50 cP or less, still more preferably 6 cP or more and 20 cP or less. When the viscosity of the photocurable composition is more than 100 cP, it may require a long time period to fill the photocurable composition into a recess out of a fine pattern on the mold upon contact of the photocurable composition with the mold, or a pattern defect may occur owing to insufficient filling. On the other hand, when the viscosity is less than 1 cP, application unevenness may occur upon application of the photocurable composition, or the photocurable composition may flow out of an end portion of the mold upon contact of the photocurable composition with the mold.

<Surface Tension of Photocurable Composition>

As the surface tension of the photocurable composition of this embodiment, the surface tension of a mixture of components excluding a solvent at 23° C. is preferably 5 mN/m or more and 70 mN/m or less, more preferably 7 mN/m or more and 35 mN/m or less, still more preferably 10 mN/m or more and 32 mN/m or less. Here, when the surface tension is set to 5 mN/m or more, the photocurable composition can be filled into a recess out of a fine pattern on the mold upon contact of the photocurable composition with the mold more easily in a short time period. Further, when the surface tension is set to 70 mN/m or less, satisfactory surface smoothness is likely to be obtained.

<Impurities Included in Photocurable Composition>

It is preferred that the photocurable composition to be used in the present invention avoid including impurities to the extent possible. The impurities as described here mean those other than the component (A), the component (B), and the additive components described above. Thus, it is preferred that the photocurable composition be obtained through a purification step. As the purification step, filtration using a filter or the like is preferred.

When the filtration using a filter is performed, specifically, it is preferred that the above-mentioned components (A) and (B) and additive components to be added as needed be mixed, and then the mixture be filtered with a filter having a pore diameter of, for example, 0.001 μm or more and 5.0 μm or less. It is more preferred that the filtration using a filter be performed in a plurality of stages or be repeated a plurality of times. In addition, the filtered liquid may be filtered again. A filter made of, for example, a polyethylene resin, polypropylene resin, fluororesin, or nylon resin can be used as the filter to be used in the filtration. However, the filter is not particularly limited thereto.

Impurities such as particles included in the photocurable composition can be removed by performing the purification step described above. Thus, the impurities such as particles can be prevented from forming unexpected unevenness in the photo-cured product to be obtained after the photocurable composition is cured to cause a pattern defect.

It is to be noted that upon use of the photocurable composition to be used in the present invention for the manufacture of a semiconductor integrated circuit, the amount of an impurity (metal impurity) containing metal atoms included in the photocurable composition is preferably reduced to the extent possible in order that the operation of a product may not be inhibited. In this case, the concentration of the metal impurity in the photocurable composition is preferably 10 ppm or less, more preferably 100 ppb or less.

<Evaluation of Polymerization Conversion Ratio of Photocurable Composition by Photoirradiation>

Figure 1:
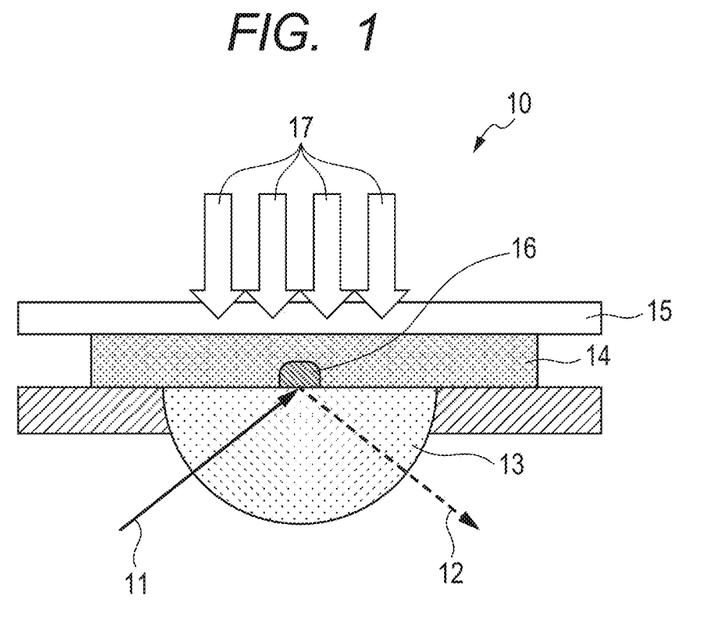
FIG. 1 is a schematic view of an attenuated total reflection infrared spectroscopic measurement device having a photoirradiation mechanism.

The polymerization conversion ratio of the photocurable composition by photoirradiation to be used in the present invention can be measured, for example, through use of an attenuated total reflection infrared spectroscopic measurement device having a photoirradiation mechanism as illustrated in FIG. 1. Here, the polymerization conversion ratio can be defined as an extinction ratio of the polymerizable functional group of the component (A) by photoirradiation. It is to be noted that this ratio is synonymous with the ratio at which the polymerizable functional group is polymerized.

In an attenuated total reflection infrared spectroscopic measurement device 1 of FIG. 1, a photocurable composition 14 is disposed between a diamond ATR crystal 13 and a quartz glass 15 provided in the attenuated total reflection infrared spectroscopic measurement device 1 of FIG. 1. The photocurable composition 14 is cured by irradiating the photocurable composition 14 with irradiation light 17 from the quartz glass 15. Here, the diamond ATR crystal 13 is irradiated with infrared light 11. Then, an evanescent wave 16 generated in a range of several μm on the diamond ATR crystal 13 is detected with a detector 12, and several or more and several tens or less per second of an attenuated total reflection infrared spectra of the photocurable composition 14 is obtained. Accordingly, the infrared spectra of the photocurable composition during photocuring can be obtained in real time. It is to be noted that the polymerization conversion ratio (%) of the photocurable composition at any exposure dose can be calculated by the following equation (1).

[Polymerization conversion ratio (%)]=100×(1−$P_2$/$P_1$)     (1)

(In the equation (1), $P_1$ represents the peak intensity (initial intensity) of a peak derived from a polymerizable functional group of the component (A) immediately after the start of photoirradiation, and $P_2$ represents the peak intensity (initial intensity) of a peak derived from a polymerizable functional group of the component (A) after exposure for any time period.)

[Method of Producing Film]

Next, the method of producing a film of the present invention is described. FIGS. 2A to 2G are schematic sectional views illustrating steps included in the method of producing a film of the present invention.

Figure 2A:
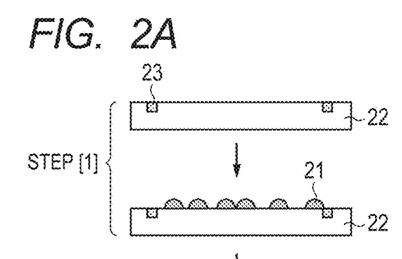
FIGS. 2A, 2B, 2C, 2D, 2E, 2F, and 2G are schematic sectional views illustrating steps included in a method of producing a film of the present invention.
Figure 2B:
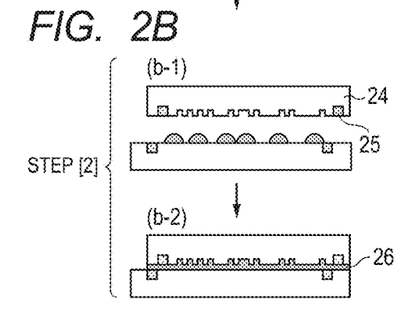
Figure 2C:
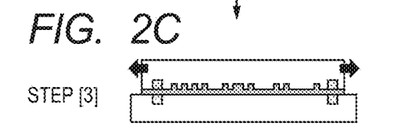

The method of producing a film of the present invention includes the following steps [1] to [5]:

[1] a step of disposing the above-mentioned photocurable composition of this embodiment on a substrate (substrate to be processed) (disposing step, FIG. 2A);

[2] a step of bringing the photocurable composition and a mold into contact with each other (mold contact step, FIG. 2B);

[3] a step of aligning the mold and the substrate with each other (alignment step, FIG. 2C);

[4] a step of irradiating the photocurable composition with light to form a cured product (photoirradiation step, FIG. 2D); and

Figure 2D:
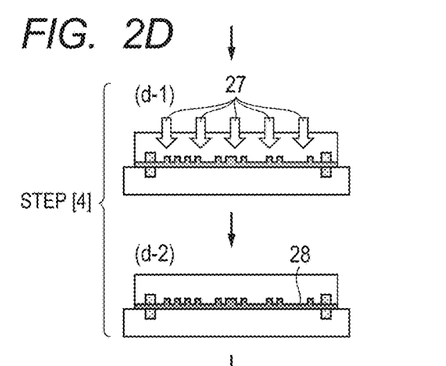
Figure 2E:
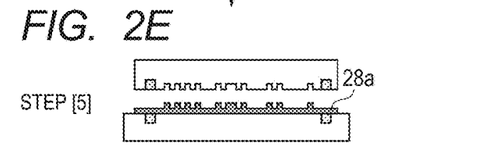

[5] a step of releasing the cured product obtained in the step [4] and the mold from each other (mold release step, FIG. 2E).

It is to be noted that the method of producing a film of the present invention is a method of producing a film involving using a photonanoimprint method. A film obtained by the production method of the present invention preferably has a pattern having a size of 1 nm or more and 10 mm or less, more preferably 10 nm or more and 100 μm or less. It is to be noted that, in general, a pattern forming technology for producing a film having a pattern (unevenness structure) of a nanosize (1 nm or more and 100 nm or less) through use of light is called a photonanoimprint method, and the method of producing a film of this embodiment uses the photonanoimprint method.

Each step is hereinafter described.

<Disposing Step (Step [1], FIG. 2A)>

In this step (disposing step), as illustrated in FIG. 2A, photocurable composition 21 described above is disposed on a substrate 22 to form an applied film.

The substrate 22, on which the photocurable composition 21 is disposed, is a substrate to be processed, and a silicon wafer is generally used. In the present invention, however, the substrate 22 is not limited to the silicon wafer, and there may be used a material arbitrarily selected from any known materials for a substrate of a semiconductor device such as aluminum, a titanium-tungsten alloy, an aluminum-silicon alloy, an aluminum-copper-silicon alloy, silicon oxide, and silicon nitride. It is to be noted that as the substrate 22 to be used (substrate to be processed), there may be used a substrate whose adhesion property to the photocurable composition is improved by surface treatment such as silane coupling treatment, silazane treatment, or formation of an organic thin film.

In the present invention, as a method of disposing (applying) the photocurable composition on the substrate to be processed, there may be used, for example, an ink jet method, a dip coating method, an air knife coating method, a curtain coating method, a wire bar coating method, a gravure coating method, an extrusion coating method, a spin coating method, or a slit scan method. In the photonanoimprint method, an ink jet method is particularly preferred.

It is to be noted that the thickness of the shape transfer layer (applied film) varies depending on the application, and is, for example, 0.01 μm or more and 100.0 μm or less.

<Mold Contact Step (Step [2], FIG. 2B)>

Next, as illustrated in FIG. 2B, a mold 24 having an original pattern for transferring a pattern shape is brought into contact with the applied film formed of the photocurable composition 21 formed in the preceding step (disposing step). In this step, when an unevenness structure on the surface of the mold 24 is brought into contact with the photocurable composition 21 (shape transfer layer) ((b-1) in FIG. 2B), a recess of the fine pattern formed on the surface of the mold 24 is filled with (part of) the applied film formed of the photocurable composition 21, with the result that an applied film 26 filled into the fine pattern of the mold 24 is obtained ((b-2) in FIG. 2B).

It is preferred that the mold 24 be constituted of an optically transparent material considering the next step (photoirradiation step). Preferred specific examples of the optically transparent constituent material for the mold 24 include the following optically transparent materials: glass, quartz, an optically transparent resin such as PMMA or a polycarbonate resin, a transparent metal-deposited film, a flexible film made of polydimethylsiloxane or the like, a photo-cured film, and a metal film. In the case of using an optically transparent resin as the constituent material for the mold 24, it is necessary to select a resin which does not dissolve in a solvent contained in the photocurable composition 21. Quartz is particularly preferred because it has a small thermal expansion coefficient.

The mold 24 may be subjected to surface treatment before this step (step of bringing the photocurable composition and the mold into contact with each other) so as to enhance the releasability between the photocurable composition 21 and the surface of the mold 24. As a method for the surface treatment, there is given a method involving forming a release agent layer by applying a release agent onto the surface of the mold 24. Here, examples of the release agent to be applied onto the surface of the mold 24 include a silicon-based release agent, a fluorine-based release agent, a polyethylene-based release agent, a polypropylene-based release agent, a paraffin-based release agent, a montan-based release agent, and a carnauba-based release agent. For example, a commercially available application-type release agent such as OPTOOL DSX manufactured by Daikin Industries, Ltd. can be preferably used. It is to be noted that one kind of the release agents may be used alone, or two or more kinds thereof may be used in combination. Of those, a fluorine-based release agent is particularly preferred.

A pressure to be applied to the photocurable composition 21 when the mold 24 and the photocurable composition 21 are brought into contact with each other in this step (mold contact step) as illustrated in (b-1) in FIG. 2B, which is not particularly limited, is typically 0 MPa or more and 100 MPa or less. Of such range, a pressure of 0 MPa or more and 50 MPa or less is preferred, a pressure of 0 MPa or more and 30 MPa or less is more preferred, and a pressure of 0 MPa or more and 20 MPa or less is still more preferred.

In addition, the time period for which the mold 24 is brought into contact with the photocurable composition 21 in this step, which is not particularly limited, is typically 0.1 second or more and 600 seconds or less, preferably 0.1 second or more and 300 seconds or less, more preferably 0.1 second or more and 180 seconds or less, particularly preferably 0.1 second or more and 120 seconds or less.

This step can be performed under any condition of an air atmosphere, a reduced pressure atmosphere, and an inert gas atmosphere. Of those atmospheres, a reduced pressure atmosphere or an inert gas atmosphere is preferred because an influence of oxygen or moisture on a photocuring reaction can be prevented. When this step is performed under an inert gas atmosphere, specific examples of the inert gas to be used include nitrogen, carbon dioxide, helium, argon, various fluorocarbon gases, and a mixed gas thereof. A preferred pressure when this step is performed under a particular gas atmosphere including an air atmosphere is 0.0001 atm or more and 10 atm or less.

Further, this step may be performed under an atmosphere of a gas containing a condensable gas. Here, the condensable gas refers to a gas which is present as a gas in the atmosphere at a stage before the contact between the photocurable composition 21 (shape transfer layer) and the mold 24 ((b-1) in FIG. 2B) in this step and liquefies when the photocurable composition 21 and the mold 24 are brought into contact with each other. In the meantime, when the photocurable composition 21 and the mold 24 are brought into contact with each other, the gas in the atmosphere is filled into the recess of the fine pattern on the surface of the mold 24, and a gap between the mold 24 and the substrate 22 together with (part of) the applied film 26. At this time, the recess and the gap are filled with (part of) the applied film 26 and the gas in the atmosphere, and the condensable gas contained in the gas in the atmosphere condenses by virtue of a capillary pressure produced by a pressure at the time of the filling to liquefy.

When the mold contact step is performed under the atmosphere of the gas containing a condensable gas, the gas filled into the recess of the fine pattern of the mold 24 liquefies and hence air bubbles are not likely to be formed. Accordingly, the filling property becomes satisfactory. It is to be noted that (at least part of) the condensable gas may be dissolved in the photocurable composition in this step.

Although the boiling point of the condensable gas in this step is not particularly limited as long as the boiling point is equal to or less than the ambient temperature of the mold contact step (Step [2]), the boiling point is preferably −10° C. or more and 23° C. or less, more preferably 10° C. or more and 23° C. or less. When the boiling point of the condensable gas falls within the range, the filling property of the photocurable composition 21 into the recess of the fine pattern on the mold surface is more excellent.

Although the vapor pressure of the gas containing the condensable gas in this step is not particularly limited as long as the vapor pressure is equal to or less than the pressure of the mold 24 when impress of the mold 24 is performed in this step, the vapor pressure is preferably 0.1 MPa or more and 0.4 MPa or less. When the vapor pressure of the gas containing the condensable gas falls within the range, the filling property of the photocurable composition 21 into the recess of the fine pattern on the mold surface is more excellent. Here, when the vapor pressure of the gas containing the condensable gas is set to 0.4 MPa or less, air bubbles are likely to disappear. Further, when the vapor pressure of the gas containing the condensable gas is set to 0.1 MPa or more, it is not necessary to perform a decompression operation in an apparatus to be used for performing this step or separately provide a decompression device, and hence an apparatus does not become complicated in most cases.

The ambient temperature in this step, which is not particularly limited, is preferably from 20° C. to 25° C.

Specific examples of the condensable gas include fluorocarbons such as: a chlorofluorocarbon (CFC) such as trichlorofluoromethane; a fluorocarbon (FC); a hydrochlorofluorocarbon (HCFC); a hydrofluorocarbon (HFC) such as 1,1,1,3,3-pentafluoropropane ($CHF_2CH_2CF_3$, HFC-245fa, PFP); and a hydrofluoroether (HFE) such as pentafluoroethyl methyl ether ($CF_3CF_2OCH_3$, HFE-245mc).

Of those condensable gases, 1,1,1,3,3-pentafluoropropane (vapor pressure at 23° C.: 0.14 MPa, boiling point: 15° C.), trichlorofluoromethane (vapor pressure at 23° C.: 0.1056 MPa, boiling point: 24° C.), and pentafluoroethyl methyl ether are preferred from such a viewpoint that when the ambient temperature in the mold contact step is from 20° C. to 25° C., the filling property is excellent. Further, 1,1,1,3,3-pentafluoropropane is particularly preferred from the viewpoint of being excellent in safety.

One kind of the condensable gases may be used alone, or two or more kinds thereof may be used as a mixture. In addition, the gas containing the condensable gas may be the condensable gas alone, or may be a mixed gas of the condensable gas and a non-condensable gas. Examples of the non-condensable gas include air, nitrogen, carbon dioxide, helium, and argon. Of those, helium is preferred from the viewpoint that the filling property of the photocurable composition 21 into the recess of the fine pattern on the mold surface is satisfactory. In the case where the non-condensable gas is helium, when a mixed gas of the condensable gas and helium is filled into the recess of the fine pattern on the surface of the mold 24 in the mold contact step together with (part of) the applied film 26, the condensable gas liquefies and helium can permeate the mold 24.

<Alignment Step (Step [3], FIG. 2C)>

After the mold contact step (FIG. 2B), as illustrated in FIG. 2C, the mold 24 is driven so that a mold side alignment mark 25 and a substrate (substrate to be processed) side alignment mark 23 are disposed at the same position.

As a specific method for alignment in this step, there is given a method involving using light (visible light, etc.) with which the photocurable composition 21 is not cured. For example, the mold side alignment mark 25 and the substrate side alignment mark 23 are irradiated with light (incident light A, not shown) from a light source (not shown), and light from the mold side alignment mark 25 and light from the substrate side alignment mark 23 (output light B, not shown) are detected with an alignment camera. Then, the position of the substrate 22 is adjusted by moving the substrate 22 so that the positional shift between the incident light A and the output light B is reduced. It is to be noted that, in such case, it is preferred that the incident light A and the output light B be reflected light or diffracted light, provided that they may be reflected light and diffracted light. Further, the mold side alignment mark 25 and the substrate side alignment mark 23 preferably have an unevenness structure, and more preferably have an unevenness structure having a periodicity.

<Photoirradiation Step (Step [4], FIG. 2D)>

Next, as illustrated in FIG. 2D, a contact portion between the photocurable composition 21 and the mold 24, more specifically, the applied film 26 filled into the fine pattern of the mold 24 is irradiated with light through the mold 24 (FIG. 2D). Consequently, the applied film 26 filled into the fine pattern of the mold 24 is cured with the irradiation light to form a cured film 28 (FIG. 2D).

Here, the light with which the photocurable composition 21 constituting the applied film 26 filled into the fine pattern of the mold 24 is irradiated is selected in accordance with the sensitivity wavelength of the photocurable composition 21. Specifically, it is preferred that ultraviolet light having a wavelength of 150 nm or more and 400 nm or less, an X-ray, an electron beam, or the like be appropriately selected and used.

Of those, the light (irradiation light 27) with which the photocurable composition 21 is irradiated is particularly preferably ultraviolet light. This is because many of the compounds commercially available as curing aids (photopolymerization initiators) have sensitivity to ultraviolet light. Here, examples of the light source of ultraviolet light include a high-pressure mercury lamp, an ultra-high pressure mercury lamp, a low-pressure mercury lamp, a Deep-UV lamp, a carbon arc lamp, a chemical lamp, a metal halide lamp, a xenon lamp, a KrF excimer laser, an ArF excimer laser, and a $F_2$ excimer laser. Of those, an ultra-high pressure mercury lamp is particularly preferred. In addition, the number of the light sources to be used may be one or more. Further, the entire surface of the applied film 26 filled into the fine pattern of the mold 24 may be irradiated with light, or a part of the surface thereof may be irradiated with light.

Further, the photoirradiation may be performed intermittently a plurality of times in an entire region or may be performed continuously in the entire region.

In the present invention, the exposure dose of the photocurable composition 21 in this step is preferably 30 $mJ/cm^2$ or less.

The reason for limiting the exposure dose is described below. In the method of producing a film of the present invention, a series of steps including the steps [1] to [5] also including the step [5] described later is repeated a plurality of times with respect to the same substrate (substrate to be processed). A repetition unit including the series of the steps (steps [1] to [5]) is referred to as "shot".

In the case where the amount of light (exposure dose) with which the photocurable composition 21 is irradiated is high in this step, the absorption of the irradiation light by the substrate 22 generates heat (exposure heat) in the substrate 22. Then, the thermal strain of the substrate 22 caused by the generated heat extends to a region irradiated with light and a region adjacent to the region (irradiated with light). Here, a thermal expansion amount is calculated with a silicon substrate (linear thermal expansion coefficient: 2.6 ppm/K) being used as the substrate 22 (substrate to be processed), an exposure region being set to a rectangular shape of 26 mm×33 mm, and an exposure dose of ultraviolet light being set to 90 $mJ/cm^2$. Then, a thermal expansion of at maximum 2.9 nm occurs in an end portion of the exposure region. Accordingly, in the case where the exposure dose of light for exposing the photocurable composition 21 is high, the next shot is usually performed with respect to an adjacent site on the substrate 22, and hence the above-mentioned thermal expansion remains in the end portion of the exposure region for the next shot, with the result that the alignment accuracy of the next shot is degraded. In this case, when the exposure dose of light (ultraviolet light) with which the photocurable composition 21 is irradiated is set to 30 $mJ/cm^2$, the thermal expansion can be reduced to 1 nm or less in terms of calculation.

<Mold Release Step (Step [5], FIG. 2E)>

Next, the cured film 28 and the mold 24 are released from each other (FIG. 2E). At this time, a cured film 28a having a predetermined pattern shape is formed on the substrate 22. In this step (mold release step), as illustrated in FIG. 2E, when the cured film 28 and the mold 24 are released from each other, the cured film 28a having a pattern shape along a reverse pattern of the fine pattern formed on the mold 24 is obtained in the step [4] (photoirradiation step).

A method of releasing the cured film 28 and the mold 24 from each other is not particularly limited as long as part of the cured film 28 does not physically fracture during the release, and various conditions for the release and the like are also not particularly limited. For example, the release may be performed as described below. The substrate 22 (substrate to be processed) is fixed and the mold 24 is moved so that the mold 24 may go away from the substrate 22. Alternatively, the release may be performed as described below. The mold 24 is fixed and the substrate 22 is moved so that the substrate 22 may go away from the mold 24. Alternatively, the release may be performed by pulling both the substrate 22 and the mold 24 in directions diametrically opposed to each other.

Through the series of steps (production process) including the steps [1] to [5] described above, a cured film having a desired unevenness pattern shape (pattern shape attributable to the uneven shape of the mold 24) at a desired position can be obtained. The resultant cured film 28a can also be utilized as an optical member such as a Fresnel lens or a diffraction grating (the case where the product is used as one member of the optical member is included). In such case, the cured film 28a can be provided as an optical component including at least the substrate 22 and the cured film 28a having a pattern shape disposed on the substrate 22.

In addition, when the mold contact step is performed under the atmosphere of the gas containing the condensable gas, the following tendency is observed: the condensable gas vaporizes in association with a reduction in pressure at the interface at which the cured film 28 and the mold 24 are in contact with each other upon release of the cured film 28 and the mold 24 from each other in the mold release step, and hence a releasing force reducing effect is exhibited.

<Repetition of Steps [1] to [5]>

Figure 3:
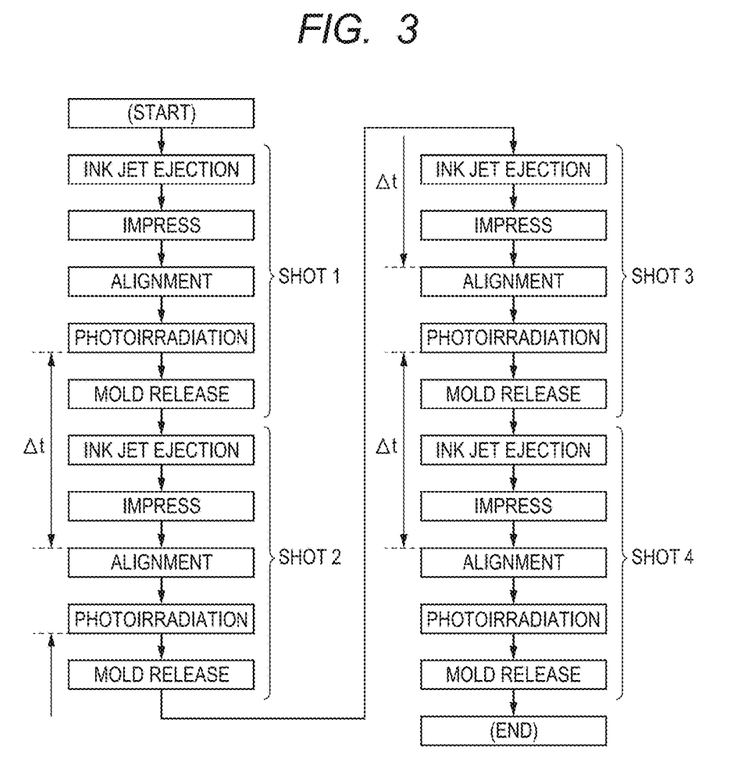
FIG. 3 is a flow chart illustrating a flow of the steps included in the method of producing a film of the present invention.

FIG. 3 is a flow chart illustrating a flow of steps included in the method of producing a film of the present invention. In the method of producing a film of the present invention, as described in the step [4], the repetition unit (shot) including the step [1] (ink jet ejection), the step [2] (impress), the step [3] (alignment), the step [4] (photoirradiation), and the step [5] (mold release) may be performed a plurality of times (FIG. 3). That is, one shot involves performing the steps [1] to [5] once. A cured film having a plurality of desired unevenness pattern shapes (pattern shapes attributable to the uneven shape of the mold 24) at desired positions on the substrate 22 (substrate to be processed) can be obtained by repeating the shot with respect to the same substrate 22 (substrate to be processed) a plurality of times. It is to be noted that the number of shots is not limited unlike the case illustrated in FIG. 3 in which the number of shots is limited to four (Shot 1 to Shot 4) in the method of producing a film of the present invention.

The required time from the mold release step in one shot to the alignment step in the next shot is preferably set to 1.2 seconds or less. This required time is a time represented by Δt in FIG. 3 and specifically refers to a time from the end of the photoirradiation step in the preceding shot to the start of the alignment step in the next shot. It is to be noted that the next shot as used here refers to a next shot of a preceding shot. For example, in the case where the preceding shot is Shot 1 of FIG. 3, the next shot corresponds to Shot 2 of FIG. 3.

<Remaining Film Removal Step of Removing Part of Cured Film (Step [6], FIG. 2F)>

Figure 2F:
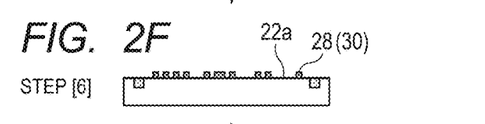
Figure 2G:
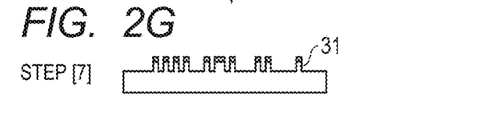

Although the cured film 28a to be obtained in the step [5] (mold release step) has a specific pattern shape, part of the film may exist as a remaining film even in a region except the region in which the pattern shape is formed (such part of the film is referred to as "remaining film" in the following description). In such case, as illustrated in FIG. 2F, a cured product pattern 30 having a desired uneven pattern shape (pattern shape attributable to the unevenness shape of the mold 24) can be obtained by removing the cured film (remaining film) remaining in a region to be removed of the obtained cured film 28a having a pattern shape.

Here, a method of removing the remaining film is, for example, a method involving removing the film (remaining film) remaining in a recess of the cured film 28a by a method such as etching to expose the surface of the substrate 22 in the recess of the pattern of the cured film 28a.

When the film remaining in a recess of the cured film 28a is removed by the etching, a specific method therefor is not particularly limited and a conventionally known method such as dry etching can be used. A conventionally known dry etching apparatus can be used in the dry etching. In addition, a source gas at the time of the dry etching is appropriately selected depending on the elemental composition of the cured film serving as a film to be etched. For example, a halogen-based gas such as $CF_4$, $C_2F_6$, $C_3F_8$, $CCl_2F_2$, $CCl_4$, $CBrF_3$, $BCl_3$, $PCl_3$, $SF_6$, or $Cl_2$, a gas containing an oxygen atom such as $O_2$, CO, or $CO_2$, an inert gas such as He, $N_2$, or Ar, or a gas of $H_2$ or $NH_3$ can be used. It is to be noted that those gases can be used as a mixture.

The cured product pattern 30 having a desired unevenness pattern shape (pattern shape attributable to the uneven shape of the mold 24) at a desired position can be obtained by the production process including the steps [1] to [6]. In addition, simultaneously with this, an article having the cured product pattern 30 can be obtained. Further, in the case of processing the substrate 22 through use of the obtained cured product pattern 30, a substrate processing step (step [7]) described later is performed.

On the other hand, an optical component can also be obtained through use of the obtained cured product pattern 30 as an optical member such as a diffraction grating or a polarizing plate (the case where the product is used as one member of the optical member is included). In such case, the cured product pattern 30 can be provided as an optical component including at least the substrate 22 and the cured product pattern 30 disposed on the substrate 22.

<Substrate Processing Step (Step [7], FIG. 2G)>

The cured product pattern 30 having an unevenness pattern shape obtained by the method of producing a film having a pattern shape of this embodiment can be utilized as, for example, a film for an interlayer insulating film in an electronic component typified by a semiconductor element such as an LSI, a system LSI, a DRAM, an SDRAM, an RDRAM, or a D-RDRAM, and can also be utilized as a resist film at the time of the manufacture of a semiconductor element.

In the case of using the cured product pattern 30 as a resist film, an electronic member is provided by performing, for example, etching or ion implantation with respect to part (region 22a of FIG. 2F) of the substrate the surface of which is exposed during the etching step corresponding to the step

[5]. Thus, a circuit board to be used in a semiconductor or the like, in which a circuit structure 31 (FIG. 2G) based on the pattern shape of the cured product pattern 30 is formed on the substrate 22, can be obtained. It is to be noted that the cured product pattern 30 serves as a mask. Further, an electronic component such as a display, a camera, or medical equipment can be formed, for example, by forming a control mechanism for controlling the circuit board and connecting the control mechanism to the circuit board. Further, similarly, an optical component can also be obtained by performing, for example, etching or ion implantation through use of the cured product pattern 30 as a resist film.

It is to be noted that when the substrate with a circuit or the electronic component is produced, the cured product pattern 30 may be finally removed from the processed substrate, but such a construction that the cured product pattern 30 is left as a constituent member for an element may also be adopted.

EXAMPLES

The present invention is described in more detail below by way of Examples, but the technical scope of the present invention is not limited to Examples described below.

Example 1

(1) Preparation of Photocurable Composition (a-1)

First, a component (A) and component (B) described below were blended. The resultant mixture was filtered with a filter made of ultrahigh molecular weight polyethylene having a pore diameter of 0.2 μm to prepare a photocurable composition (a-1) of this example (Example 1).

(1-1) Component (A): 94 Parts by Weight in Total
<A-1> Isobornyl acrylate (manufactured by Kyoeisha Chemical Co., Ltd., trade name: IB-XA): 9.0 parts by weight
<A-2> Benzyl acrylate (manufactured by Osaka Organic Chemical Industry Ltd., trade name: V#160): 38.0 parts by weight
<A-3> Neopentyl glycol diacrylate (manufactured by Kyoeisha Chemical Co., Ltd., trade name: NP-A): 47.0 parts by weight (1-2) Component (B): 3 Parts by Weight in Total
<B-1> 2-Benzyl-2-dimethylamino-1-(4-morpholinophenyl)-1-butanone represented by the following formula (2) (trade name: Irgacure 369, manufactured by BASF): 3 parts by weight (2)

(2) Evaluation of Polymerization Conversion Ratio by Attenuated Total Reflection Infrared Spectroscopy About 10 μL of the prepared photocurable composition (a-1) were taken and dropped onto a diamond ATR crystal on an attenuated total reflection infrared spectroscopic measurement device to form an applied film. Then, the applied film of the photocurable composition (a-1) was covered with a quartz glass having a thickness of 1 mm.

Next, the applied film was irradiated with light emitted from a UV light source having an ultra-high pressure mercury lamp from above the quartz glass for 10 seconds. It is to be noted that the light emitted from the UV light source passed through an interference filter described later and the quartz glass in the stated order before reaching the applied film. Further, VPF-25C-10-15-31300 (manufactured by SIGMAKOKI CO., LTD.) was used as the interference filter used for photoirradiation. At this time, the wavelength of ultraviolet light serving as irradiation light was set to single wavelength light of 313±5 nm, and the illuminance was set to 0.12 mW/cm$^2$. Further, the reduction speed of an acryl group contained in the component (A) forming the photocurable composition (a-1) during the photoirradiation (reaction speed of a polymerization reaction of the component (A)) was evaluated by the following method.

The measurement of attenuated total reflection infrared spectra was started simultaneously with the start of the photoirradiation to the applied film, and the measurement was performed 2.7 times per second while the photoirradiation was continued to obtain data. Here, a minimum exposure dose (half decay exposure) required for the area intensity of a peak at 810 cm$^{-1}$ derived from the acryl group of the component (A) to reach 50% or less of an initial value immediately after the start of the photoirradiation, that is, a minimum exposure dose (half decay exposure dose) required for the polymerization conversion ratio to reach 50% or more was measured. Consequently, the half decay exposure dose was 0.49 mJ/cm$^2$ (illuminance: 0.12 mW/cm$^2$, exposure time: 4.1 seconds). That is, it was confirmed that the polymerization conversion ratio reached 50% or more under the conditions of an illuminance of 0.12 mW/cm$^2$ and an exposure time of 11.0 seconds. Further, this value was smaller than that of a photocurable composition (b-1) of Comparative Example 1 described later. That is, it was found that the photocurable composition (a-1) was cured sufficiently even when the exposure time was shorter than that of the photocurable composition (b-1).

(3) Observation of Nanoimprint Pattern

Next, a nanoimprint pattern of the photocurable composition (a-1) was formed by the method described below, and the nanoimprint pattern was observed with an electron microscope.

(3-1) Disposing Step

A total of 1,440 droplets of the photocurable composition (a-1) (11 μL per droplet) were dropped onto a 300-mm silicon wafer having formed thereon an adhesion promoting layer having a thickness of 3 nm serving as an adhesion layer by an ink jet method. It is to be noted that the respective droplets were dropped so that the respective droplets were disposed at substantially equal intervals in a region measuring 26 mm wide by 33 mm long.

(3-2) Mold Contact Step and Photoirradiation Step

Next, a quartz mold (measuring 26 mm wide by 33 mm long) having a 28-nm line-and-space (L/S) pattern formed thereon and being subjected to no surface treatment was brought into contact with the photocurable composition (a-1) on the silicon wafer.

Next, 30 seconds after the contact with the quartz mold, the photocurable composition was irradiated with UV light by using a UV light source provided with a 200-W mercury-xenon lamp (EXECURE 3000 manufactured by HOYA CANDEO OPTRONICS CORPORATION) through the quartz mold. It is to be noted that upon irradiation with the UV light, an interference filter capable of selectively transmitting light having a wavelength of 313±5 nm (VPF-50C-10-25-31300 manufactured by SIGMAKOKI CO., LTD.)

was placed between the UV light source and the quartz mold. In addition, the illuminance of the UV light directly below the quartz mold was set to 40 mW/cm² at a wavelength of 313 nm. The irradiation with the UV light was performed under the conditions for 0.75 second (exposure: 30 mJ/cm²).

(3-3) Mold Release Step

Next, the quartz mold was released from the photo-cured film by lifting the quartz mold under the condition of 0.5 mm/s.

(3-4) Observation of Nanoimprint Pattern with Electron Microscope

A region measuring 6.75 μm on four sides of the nanoimprint pattern was observed with an electron microscope to find that a satisfactory pattern without defects such as pattern collapse was formed. It is to be noted that the pattern collapse refers to a state in which at least part of adjacent lines of a 28-nm line-and-space (L/S) pattern are in contact with each other.

As described above, the photocurable composition (a-1) can form a satisfactory pattern with an exposure dose of 30 mJ/cm², and hence the thermal strain remaining in the next shot is 1 nm or less, with the result that it is expected that high alignment accuracy is obtained.

Example 2

(1) Preparation of Photocurable Composition (a-2)

A photocurable composition (a-2) was prepared by the same method as that of Example 1 with the exception that in Example 1, the component (B) was changed to 3 parts by weight of <B-2>2,4,6-trimethylbenzoyldiphenylphosphine oxide represented by the following formula (3) (trade mane: Lucirin TPO (manufactured by BASF)) and 0.5 part by weight of <B-3> N,N,N'N'-tetraethyl-4,4'-diaminobenzophenone.

(3)

(2) Evaluation of Polymerization Conversion Ratio by Attenuated Total Reflection Infrared Spectroscopy A half decay exposure dose of the photocurable composition (a-2) was measured in the same way as in Example 1 to be 1.03 mJ/cm² (illuminance: 0.12 mW/cm², exposure time: 8.6 seconds). That is, it was confirmed that the polymerization conversion ratio reached 50% or more under the conditions of an illuminance of 0.12 mW/cm² and an exposure time of 11.0 seconds. Further, this value was smaller than that of a photocurable composition (b-1) of Comparative Example 1 described later. That is, it was found that the photocurable composition (a-2) was cured sufficiently even when the exposure time was shorter than that of the photocurable composition (b-1).

(3) Observation of Nanoimprint Pattern

A nanoimprint pattern of the photocurable composition (a-2) was formed in the same way as in Example 1, and the nanoimprint pattern was observed with an electron microscope to find that a satisfactory pattern without defects such as pattern collapse was formed.

As described above, the photocurable composition (a-2) can form a satisfactory pattern with an exposure dose of 30 mJ/cm², and hence the thermal strain remaining in the next shot is 1 nm or less, with the result that it is expected that high alignment accuracy is obtained.

Example 3

(1) Preparation of Photocurable Composition (a-3)

A component (A), component (B), and additive component (C) described below were blended. The resultant mixture was filtered with a filter made of ultrahigh molecular weight polyethylene having a pore diameter of 0.2 μm to prepare a photocurable composition (a-3).

(1-1) Component (A): 100 Parts by Weight in Total

<A-2> Benzyl acrylate (manufactured by Osaka Organic Chemical Industry Ltd., trade name: V#160): 50 parts by weight <A-4> Dimethyloltricyclodecane diacrylate (manufactured by Kyoeisha Chemical Co., Ltd., trade name: DCP-A): 50 parts by weight (1-2) Component (B): 3.5 Parts by Weight in Total <B-2> Lucirin TPO (manufactured by BASF): 3 parts by weight <B-3>4,4'-Bis(diethylamino)benzophenone (manufactured by Tokyo Chemical Industry Co., Ltd.): 0.5 part by weight (1-3) Additive Component (C) Other than Component (A) and Component (B): 1.6 Parts by Weight in Total <C-1> Polyoxyethylene stearyl ether SR-730 (manufactured by AOKI OIL INDUSTRIAL CO., LTD.): 1.6 parts by weight (2) Evaluation of Polymerization Conversion Ratio by Attenuated Total Reflection Infrared Spectroscopy A half decay exposure dose of the photocurable composition (a-3) was measured in the same way as in Example 1 to be 1.32 mJ/cm² (illuminance: 0.12 mW/cm², exposure time: 11.0 seconds). That is, it was confirmed that the polymerization conversion ratio reached 50% or more under the conditions of an illuminance of 0.12 mW/cm² and an exposure time of 11.0 seconds. Further, this value was smaller than that of a photocurable composition (b-1) of Comparative Example 1 described later. That is, it was found that the photocurable composition (a-3) was cured sufficiently even when the exposure time was shorter than that of the photocurable composition (b-1).

In the nanoimprint method involving using the photocurable composition (a-3), it is expected that there are no defects such as pattern collapse and high alignment accuracy is obtained in the same way as in Examples 1 and 2.

Example 4

(1) Preparation of Photocurable Composition (a-4)

A component (A), component (B), and additive component (C) described below were blended. The resultant mixture was filtered with a filter made of ultrahigh molecular weight polyethylene having a pore diameter of 0.2 μm to prepare a photocurable composition (a-4).

(1-1) Component (A): 100 Parts by Weight in Total
<A-2> Benzyl acrylate (manufactured by Osaka Organic Chemical Industry Ltd., trade name: V#160): 60 parts by weight
<A-4> Dimethyloltricyclodecane diacrylate (manufactured by Kyoeisha Chemical Co., Ltd., trade name: DCP-A): 40 parts by weight
(1-2) Component (B): 3.5 Parts by Weight in Total
<B-2> Lucirin TPO (manufactured by BASF): 3 parts by weight
<B-3> 4,4'-Bis(diethylamino)benzophenone (manufactured by Tokyo Chemical Industry Co., Ltd.): 0.5 part by weight
(1-3) Additive Component (C) Other than Component (A) and component (B): 1.6 parts by weight in total
<C-1> Polyoxyethylene stearyl ether SR-730 (manufactured by AOKI OIL INDUSTRIAL CO., LTD.): 1.6 parts by weight
(2) Evaluation of Polymerization Conversion Ratio by Attenuated Total Reflection Infrared Spectroscopy A half decay exposure dose of the photocurable composition (a-4) was measured in the same way as in Example 1 to be 1.28 mJ/cm$^2$ (illuminance: 0.12 mW/cm$^2$, exposure time: 10.7 seconds). That is, it was confirmed that the polymerization conversion ratio reached 50% or more under the conditions of an illuminance of 0.12 mW/cm$^2$ and an exposure time of 11.0 seconds. Further, this value was smaller than that of a photocurable composition (b-1) of Comparative Example 1 described later. That is, it was found that the photocurable composition (a-4) was cured sufficiently even when the exposure time was shorter than that of the photocurable composition (b-1).

In the nanoimprint method involving using the photocurable composition (a-4), it is expected that there are no defects such as pattern collapse and high alignment accuracy is obtained in the same way as in Examples 1 and 2.

Example 5

(1) Preparation of Photocurable Composition (a-5)

A component (A), component (B), and additive component (C) described below were blended. The resultant mixture was filtered with a filter made of ultrahigh molecular weight polyethylene having a pore diameter of 0.2 μm to prepare a photocurable composition (a-5).

(1-1) Component (A): 100 Parts by Weight in Total
<A-2> Benzyl acrylate (manufactured by Osaka Organic Chemical Industry Ltd., trade name: V#160): 50 parts by weight
<A-5> Phenylethylene glycol diacrylate represented by the following formula (4): 50 parts by weight (4)

(1-2) Component (B): 3.5 Parts by Weight in Total
<B-2> Lucirin TPO (manufactured by BASF): 3 parts by weight
<B-3> 4,4'-Bis(diethylamino)benzophenone (manufactured by Tokyo Chemical Industry Co., Ltd.): 0.5 part by weight
(1-3) Additive Component (C) Other than Component (A) and component (B): 0.8 part by weight in total
<C-3> Polyoxyethylene stearyl ether EMULGEN 320P (manufactured by Kao Corporation): 0.8 part by weight
(2) Evaluation of Polymerization Conversion Ratio by Attenuated Total Reflection Infrared Spectroscopy A half decay exposure dose of the photocurable composition (a-5) was measured in the same way as in Example 1 to be 1.12 mJ/cm$^2$ (illuminance: 0.12 mW/cm$^2$, exposure time: 9.3 seconds). That is, it was confirmed that the polymerization conversion ratio reached 50% or more under the conditions of an illuminance of 0.12 mW/cm$^2$ and an exposure time of 11.0 seconds. Further, this value was smaller than that of a photocurable composition (b-1) of Comparative Example 1 described later. That is, it was found that the photocurable composition (a-5) was cured sufficiently even when the exposure time was shorter than that of the photocurable composition (b-1).

In the nanoimprint method involving using the photocurable composition (a-5), it is expected that there are no defects such as pattern collapse and high alignment accuracy is obtained in the same way as in Examples 1 and 2.

Example 6

(1) Preparation of Photocurable Composition (a-6)

A component (A), component (B), and additive component (C) described below were blended. The resultant mixture was filtered with a filter made of ultrahigh molecular weight polyethylene having a pore diameter of 0.2 μm to prepare a photocurable composition (a-6).

(1-1) Component (A): 100 Parts by Weight in Total
<A-2> Benzyl acrylate (manufactured by Osaka Organic Chemical Industry Ltd., trade name: V#160): 50 parts by weight
<A-6> m-Xylylene diacrylate represented by the following formula (5): 50 parts by weight (5)

(1-2) Component (B): 3.5 Parts by Weight in Total
<B-2> Lucirin TPO (manufactured by BASF): 3 parts by weight
<B-3> 4,4'-Bis(diethylamino)benzophenone (manufactured by Tokyo Chemical Industry Co., Ltd.): 0.5 part by weight
(1-3) Additive Component (C) Other than Component (A) and component (B): 0.8 part by weight in total
<C-3> Polyoxyethylene stearyl ether EMULGEN 320P (manufactured by Kao Corporation): 0.8 part by weight
(2) Evaluation of Polymerization Conversion Ratio by Attenuated Total Reflection Infrared Spectroscopy A half decay exposure dose of the photocurable composition (a-6) was measured in the same way as in Example 1 to be 0.79 mJ/cm$^2$ (illuminance: 0.12 mW/cm$^2$, exposure time: 6.6 seconds). That is, it was confirmed that the polymerization conversion ratio reached 50% or more under the conditions of an illuminance of 0.12 mW/cm$^2$ and an exposure time of 11.0 seconds. Further, this value was smaller than that of a photocurable composition (b-1) of Comparative Example 1 described later. That is, it was found that the photocurable composition (a-6) was cured sufficiently even when the exposure time was shorter than that of the photocurable composition (b-1).

In the nanoimprint method involving using the photocurable composition (a-6), it is expected that there are no defects such as pattern collapse and high alignment accuracy is obtained in the same way as in Examples 1 and 2.

Comparative Example 1

(1) Preparation of Photocurable Composition [b-1]

A photocurable composition (b-1) was prepared by the same method as that of Example 1 with the exception that in Example 1, the component (B) was changed to 3 parts by weight of <B-4> Irgacure 651 (manufactured by BASF).

(2) Evaluation of Photopolymerization Speed by Attenuated Total Reflection Infrared Spectroscopy A half decay exposure of the photocurable composition (b-1) was measured in the same way as in Example 1 to be 6.3 mJ/cm$^2$ (illuminance: 0.12 mW/cm$^2$, exposure time: 52.5 seconds). That is, it was confirmed that the polymerization conversion ratio was less than 50% under the conditions of an illuminance of 0.12 mW/cm$^2$ and an exposure time of 11.0 seconds. Further, the value of the half decay exposure was larger than that of the photocurable composition (a-1) of Example 1 described above and that of the photocurable composition (a-2) of Example 2 described above. That is, it was found that the photocurable composition (b-1) required an exposure dose larger than that of each of the photocurable compositions (a-1) and (a-2) so as to be cured sufficiently.

(3) Observation of Nanoimprint Pattern

A nanoimprint pattern of the photocurable composition (b-1) was formed in the same way as in Example 1 and observed with an electron microscope to find that about 50% or more of the pattern had defects such as collapse.

Further, a minimum exposure dose required for the photocurable composition (b-1) to form a satisfactory pattern without defects such as pattern collapse was investigated and found to be 190 mJ/cm$^2$ or more. It is predicted that with this exposure dose, the thermal strain remaining in the next shot is 2.9 nm or more, and alignment accuracy is lower than that of each of Examples 1 and 2.

Comparative Example 2

(1) Preparation of Photocurable Composition [b-2]

A photocurable composition (b-2) was prepared by the same method as that of Example 1 with the exception that in Example 1, the component (B) was changed to 4 parts by weight of <B-2> Lucirin TPO (manufactured by BASF).

(2) Evaluation of Photopolymerization Speed by Attenuated Total Reflection Infrared Spectroscopy A half decay exposure dose of the photocurable composition (b-2) was measured in the same way as in Example 1 to be 1.33 mJ/cm$^2$ (illuminance: 0.12 mW/cm$^2$, exposure time: 11.1 seconds). That is, it was confirmed that the polymerization conversion ratio was less than 50% under the conditions of an illuminance of 0.12 mW/cm$^2$ and an exposure time of 11.0 seconds. Further, the value of the half decay exposure dose was larger than that of the photocurable composition (a-1) of Example 1 described above and that of the photocurable composition (a-2) of Example 2 described above. That is, it was found that the photocurable composition (b-2) required an exposure dose larger than that of each of the photocurable compositions (a-1) and (a-2) so as to be cured sufficiently.

(3) Observation of Nanoimprint Pattern

A nanoimprint pattern of the photocurable composition (b-2) was formed in the same way as in Example 1 and observed with an electron microscope to find that about 50% or more of the pattern had defects such as collapse.

Further, a minimum exposure dose required for the photocurable composition (b-2) to form a satisfactory pattern without defects such as pattern collapse was investigated and found to be 60 mJ/cm$^2$ or more. It is predicted that with this exposure dose, the thermal strain remaining in the next shot is 2.9 nm or more, and alignment accuracy is lower than that of each of Examples 1 and 2.

As described above, the method of producing a film of the present invention can produce a film having high alignment accuracy and having less pattern collapse defects. Further, the method of producing a film of the present invention can be used for producing an optical component, a circuit board, an electronic component, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-192965, filed Sep. 18, 2013 and Japanese Patent Application No. 2014-035124, filed Feb. 26, 2014 which are hereby incorporated by reference herein in their entirety.

The invention claimed is:

1. A method of producing a film, comprising:
   a disposing step of disposing a photocurable composition on a substrate;
   a mold contact step of bringing the photocurable composition and a mold into contact with each other;
   a photoirradiation step of irradiating the photocurable composition with light to form a cured product; and
   a mold release step of releasing the cured product and the mold from each other,
   wherein the method further comprises an alignment step of aligning the mold and the substrate with each other between the mold contact step and the photoirradiation step,
   wherein the photocurable composition contains at least a polymerizable compound serving as a component (A) and a photopolymerization initiator serving as a component (B),
   wherein the polymerizable compound has a polymerization conversion ratio of 50% or more when exposed to light under conditions of an illuminance of 0.12 mW/cm$^2$ and an exposure time of 11.0 seconds, and
   wherein when the disposing step, the mold contact step, the alignment step, the photoirradiation step, and the mold release step are defined as one shot and the method comprises a plurality of shots, a required time from the mold release step in a shot of the plurality of shots to the alignment step in a next shot of the plurality of shots is 1.2 seconds or less.

2. The method according to claim 1, wherein in the photoirradiation step, an exposure dose of the photocurable composition is 30 mJ/cm$^2$ or less.

3. The method according to claim 1, wherein the photocurable composition contains a (meth)acrylic compound serving as the component (A).

4. The method according to claim 1, wherein the component (A) contained in the photocurable composition comprises 90 wt % or more of a (meth)acrylic compound.

5. The method according to claim 1, wherein the component (A) includes at least any one of isobornyl acrylate, benzyl acrylate, neopentyl glycol diacrylate, 1,6-hexanediol diacrylate, dimethyloltricyclodecane diacrylate, phenylethylene glycol diacrylate, m-xylylene diacrylate, and 2-naphthylmethyl acrylate.

6. The method according to claim 1, wherein the photocurable composition contains one of an aromatic ketone derivative and a phosphine oxide derivative serving as the component (B).

7. The method according to claim 1, wherein the photocurable composition contains 2-benzyl-2-dimethylamino-1-(4-morpholinophenyl)-1-butanone serving as the component (B).

8. The method according to claim 1, wherein the photocurable composition contains 2,4,6-trimethylbenzoyldiphenylphosphine oxide serving as the component (B).

9. The method according to claim 1, wherein the photocurable composition contains N,N,N',N'-tetraethyl-4,4'-diaminobenzophenone serving as the component (B).

10. The method according to claim 1, wherein the mold contact step is performed in an atmosphere of a gas containing a condensable gas.

11. The method according to claim 10, wherein the condensable gas comprises 1,1,1,3,3-pentafluoropropane.

12. The method according to claim 10, wherein the gas containing the condensable gas comprises a mixed gas of 1,1,1,3,3-pentafluoropropane and helium.

13. A method of producing an optical component, comprising obtaining a film having a predetermined pattern shape by a method comprising:
- a disposing step of disposing a photocurable composition on a substrate;
- a mold contact step of bringing the photocurable composition and a mold into contact with each other;
- a photoirradiation step of irradiating the photocurable composition with light to form a cured product; and
- a mold release step of releasing the cured product and the mold from each other,
- wherein the method further comprises an alignment step of aligning the mold and the substrate with each other between the mold contact step and the photoirradiation step,
- wherein the photocurable composition contains at least a polymerizable compound serving as a component (A) and a photopolymerization initiator serving as a component (B),
- wherein the polymerizable compound has a polymerization conversion ratio of 50% or more when exposed to light under conditions of an illuminance of 0.12 mW/cm$^2$ and an exposure time of 11.0 seconds, and
- wherein when the disposing step, the mold contact step, the alignment step, the photoirradiation step, and the mold release step are defined as one shot and the method comprises a plurality of shots, a required time from the mold release step in a shot of the plurality of shots to the alignment step in a next shot of the plurality of shots is 1.2 seconds or less.

14. A method of producing an optical component, comprising:
a film forming step of obtaining a film having a predetermined pattern shape by a method comprising:
- a disposing step of disposing a photocurable composition on a substrate;
- a mold contact step of bringing the photocurable composition and a mold into contact with each other;
- a photoirradiation step of irradiating the photocurable composition with light to form a cured product; and
- a mold release step of releasing the cured product and the mold from each other,
- wherein the method further comprises an alignment step of aligning the mold and the substrate with each other between the mold contact step and the photoirradiation step,
- wherein the photocurable composition contains at least a polymerizable compound serving as a component (A) and a photopolymerization initiator serving as a component (B),
- wherein the polymerizable compound has a polymerization conversion ratio of 50% or more when exposed to light under conditions of an illuminance of 0.12 mW/cm$^2$ and an exposure time of 11.0 seconds, and
- wherein when the disposing step, the mold contact step, the alignment step, the photoirradiation step, and the mold release step are defined as one shot and the method comprises a plurality of shots, a required time from the mold release step in a shot of the plurality of shots to the alignment step in a next shot of the plurality of shots is 1.2 seconds or less; and
a substrate processing step of performing one of etching and ion implantation with respect to the substrate through use of the predetermined pattern shape of the film as a mask.

15. A method of producing a circuit board, comprising:
a film forming step of obtaining a film having a predetermined pattern shape by a method comprising:
- a disposing step of disposing a photocurable composition on a substrate;
- a mold contact step of bringing the photocurable composition and a mold into contact with each other;
- a photoirradiation step of irradiating the photocurable composition with light to form a cured product; and
- a mold release step of releasing the cured product and the mold from each other,
- wherein the method further comprises an alignment step of aligning the mold and the substrate with each other between the mold contact step and the photoirradiation step,
- wherein the photocurable composition contains at least a polymerizable compound serving as a component (A) and a photopolymerization initiator serving as a component (B),
- wherein the polymerizable compound has a polymerization conversion ratio of 50% or more when exposed to light under conditions of an illuminance of 0.12 mW/cm$^2$ and an exposure time of 11.0 seconds, and
- wherein when the disposing step, the mold contact step, the alignment step, the photoirradiation step, and the mold release step are defined as one shot and the method comprises a plurality of shots, a required time from the mold release step in a shot of the plurality of shots to the alignment step in a next shot of the plurality of shots is 1.2 seconds or less;

a substrate processing step of performing one of etching and ion implantation with respect to the substrate through use of the predetermined pattern shape of the film as a mask; and a step of forming an electronic member on the substrate.

16. A method of producing an electronic component, comprising:

obtaining a circuit board by a method comprising:
a film forming step of obtaining a film having a predetermined pattern shape by a method comprising:
a disposing step of disposing a photocurable composition on a substrate;
a mold contact step of bringing the photocurable composition and a mold into contact with each other;
a photoirradiation step of irradiating the photocurable composition with light to form a cured product; and
a mold release step of releasing the cured product and the mold from each other,
wherein the method further comprises an alignment step of aligning the mold and the substrate with each other between the mold contact step and the photoirradiation step,
wherein the photocurable composition contains at least a polymerizable compound serving as a component (A) and a photopolymerization initiator serving as a component (B),
wherein the polymerizable compound has a polymerization conversion ratio of 50% or more when exposed to light under conditions of an illuminance of 0.12 mW/cm$^2$ and an exposure time of 11.0 seconds, and
wherein when the disposing step, the mold contact step, the alignment step, the photoirradiation step, and the mold release step are defined as one shot and the method comprises a plurality of shots, a required time from the mold release step in a shot of the plurality of shots to the alignment step in a next shot of the plurality of shots is 1.2 seconds or less;

a substrate processing step of performing one of etching and ion implantation with respect to the substrate through use of the predetermined pattern shape of the film as a mask; and a step of forming an electronic member on the substrate; and connecting the circuit board and a control mechanism for controlling the circuit board to each other.

17. A method of producing a semiconductor device, comprising:

a film forming step of obtaining a film having a predetermined pattern shape by a method comprising:
a disposing step of disposing a photocurable composition on a substrate;
a mold contact step of bringing the photocurable composition and a mold into contact with each other;
a photoirradiation step of irradiating the photocurable composition with light to form a cured product; and
a mold release step of releasing the cured product and the mold from each other,
wherein the method further comprises an alignment step of aligning the mold and the substrate with each other between the mold contact step and the photoirradiation step,
wherein the photocurable composition contains at least a polymerizable compound serving as a component (A) and a photopolymerization initiator serving as a component (B),
wherein the polymerizable compound has a polymerization conversion ratio of 50% or more when exposed to light under conditions of an illuminance of 0.12 mW/cm$^2$ and an exposure time of 11.0 seconds, and
wherein when the disposing step, the mold contact step, the alignment step, the photoirradiation step, and the mold release step are defined as one shot and the method comprises a plurality of shots, a required time from the mold release step in a shot of the plurality of shots to the alignment step in a next shot of the plurality of shots is 1.2 seconds or less; and a substrate processing step of performing one of etching and ion implantation with respect to the substrate through use of the predetermined pattern shape of the film as a mask.

* * * * *